(12) United States Patent
Castellucci et al.

(10) Patent No.: US 6,201,489 B1
(45) Date of Patent: Mar. 13, 2001

(54) METHOD AND CIRCUIT FOR TEMPORAL CANCELLATION OF DC OFFSET

(75) Inventors: Gregg R. Castellucci, Plattsburgh, NY (US); Kevin B. Ohlson, Charlotte; Sharon Von Bruns, Westford, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/531,946

(22) Filed: Mar. 21, 2000

(51) Int. Cl.$^7$ ........................................ H03M 1/48
(52) U.S. Cl. .................. 341/111; 341/120; 327/95; 327/96
(58) Field of Search .................. 341/111, 113, 341/112, 133, 118, 120, 131, 122; 327/307, 96, 94, 95

(56) References Cited

U.S. PATENT DOCUMENTS

| | | |
|---|---|---|
| 4,377,759 | 3/1983 | Ohhata et al. . |
| 4,827,161 | 5/1989 | Kunitoki et al. . |
| 5,517,141 * | 5/1996 | Abdi et al. ............................ 327/96 |
| 5,565,809 | 10/1996 | Shou et al. . |
| 5,689,201 * | 11/1997 | Temes et al. ........................ 327/95 |
| 5,757,219 | 5/1998 | Weedon et al. . |
| 6,084,538 * | 7/2000 | Kostelnik et al. .................. 341/120 |

* cited by examiner

Primary Examiner—Brian Young
Assistant Examiner—John B Nguyen
(74) Attorney, Agent, or Firm—McGuireWoods, LLP; Eugene I. Shkurko, Esq.

(57) ABSTRACT

A DC offset cancellation circuit receives two input signals. A first one of the input signals is amplified by an amplifier, and the amplified output signal of the amplifier is tracked and held during a first clock phase. Simultaneously, during the first clock phase, the second one of the input signals is tracked and held. During the second clock phase succeeding the first clock phase, the stored second one of the input signals is amplified by the same amplifier that was used to amplify the first one of the input signals. The amplified and stored first one of the input signals and the amplified second one of the input signals are summed during the second clock phase to remove any DC offset. The summed signals are sampled and held during the second clock phase. The offset of the summer circuit can be canceled by sequential digital processing.

9 Claims, 4 Drawing Sheets

METHOD AND CIRCUIT FOR TEMPORAL CANCELLATION OF DC OFFSET

BACKGROUND OF THE INVENTION

1. Field of the Invention

The present invention generally relates to differential and other amplifiers and, more particularly, to methods of reducing DC offset for low power applications.

2. Background Description

Power supply voltages continue to decrease as technology advances and as applications require lower voltages and longer battery life. DC offsets introduced by device mismatches are therefore becoming a larger percentage of the total power supply, thereby reducing the available dynamic range. Matching components on an integrated circuit is difficult and has not improved as rapidly as technology and power supply scaling. The subject of this invention is a circuit topology or architecture for DC offset cancellation.

SUMMARY OF THE INVENTION

The DC offset cancellation circuit according to the invention receives two input signals. A first one of the input signals is amplified by an amplifier, and the amplified output signal of the amplifier is tracked and held during a first clock phase. Simultaneously, during the first clock phase, the second one of the input signals is tracked and held. During the second clock phase succeeding the first clock phase, the stored second one of the input signals is amplified by the same amplifier that was used to amplify the first one of the input signals. The amplified and stored first one of the input signals and the amplified second one of the input signals are summed during the second clock phase to remove any DC offset. The summed signals are sampled and held during the second clock phase. The offset of the summer circuit can be canceled by sequential digital processing.

BRIEF DESCRIPTION OF THE DRAWINGS

The foregoing and other aspects and advantages of the invention will be better understood from the following detailed description of a preferred embodiment of the invention with reference to the drawings, in which.

DETAILED DESCRIPTION OF A PREFERRED EMBODIMENT OF THE INVENTION

Figure 1:
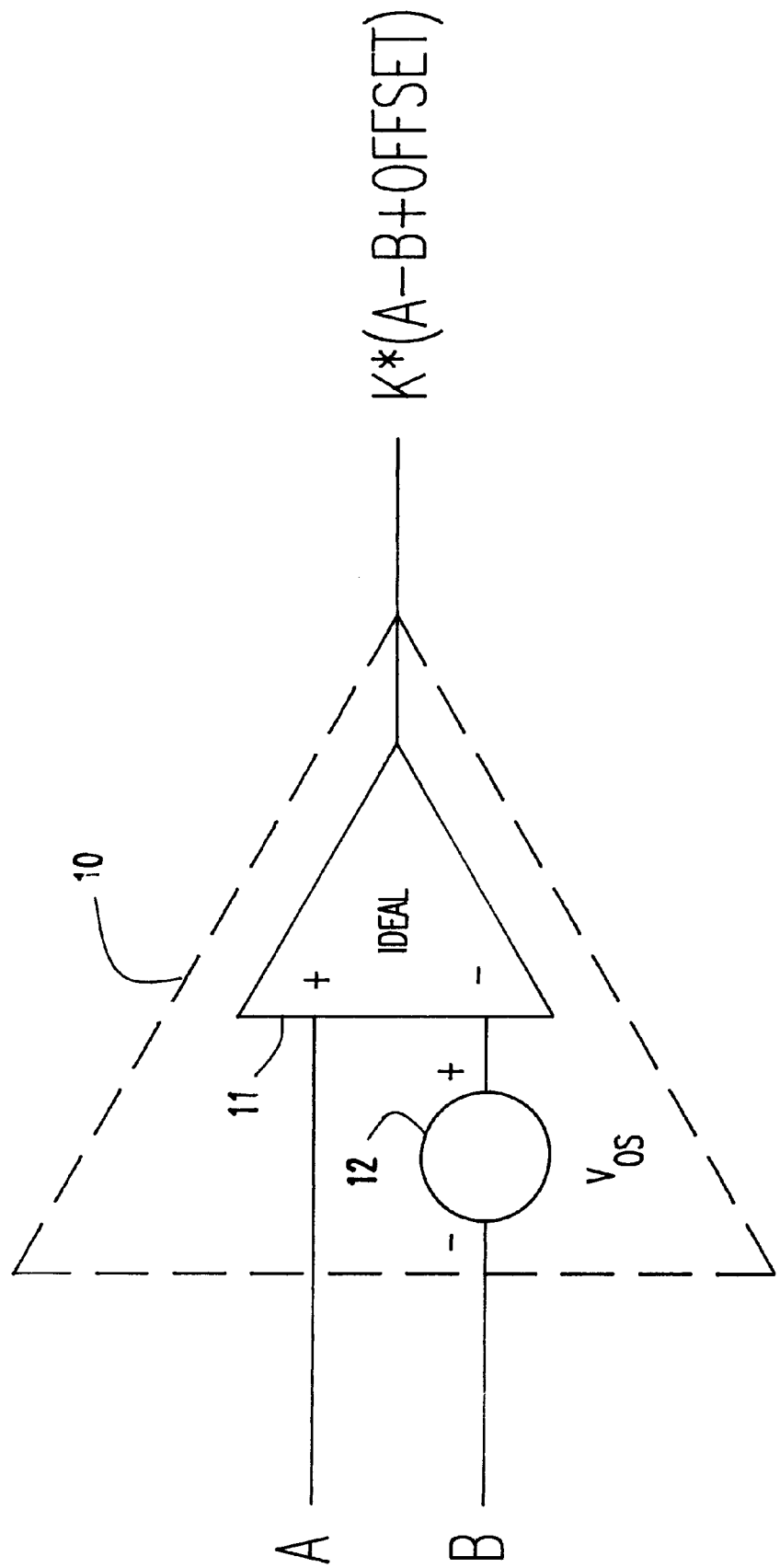
FIG. 1 is a block diagram showing a prior art differential amplifier having two inputs, one of which includes a DC offset.

Referring now to the drawings, and more particularly to FIG. 1, there is shown a simple model of an amplifier including DC offset. Two signals A and B are input to a differential amplifier 10. The amplifier 10 is represented as being composed of an ideal amplifier 11 and a DC offset 12. The amplified difference at the output is the gain of the amplifier, here represented by K, times the sum of signals plus the DC offset. The DC offset introduced by the front end of the amplifier introduces an error in the output signal.

Figure 2:
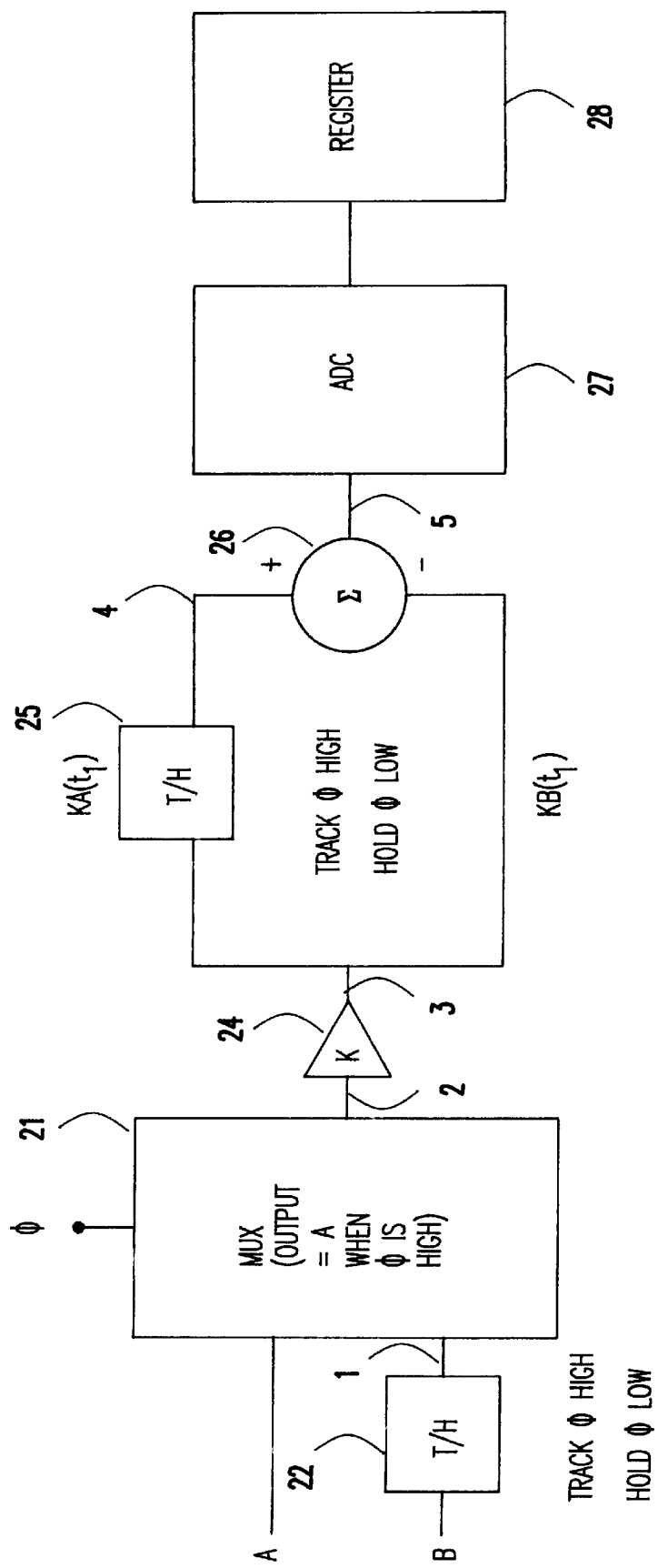
FIG. 2 is a block diagram of the temporal offset cancellation system according to the invention.
Figure 3:
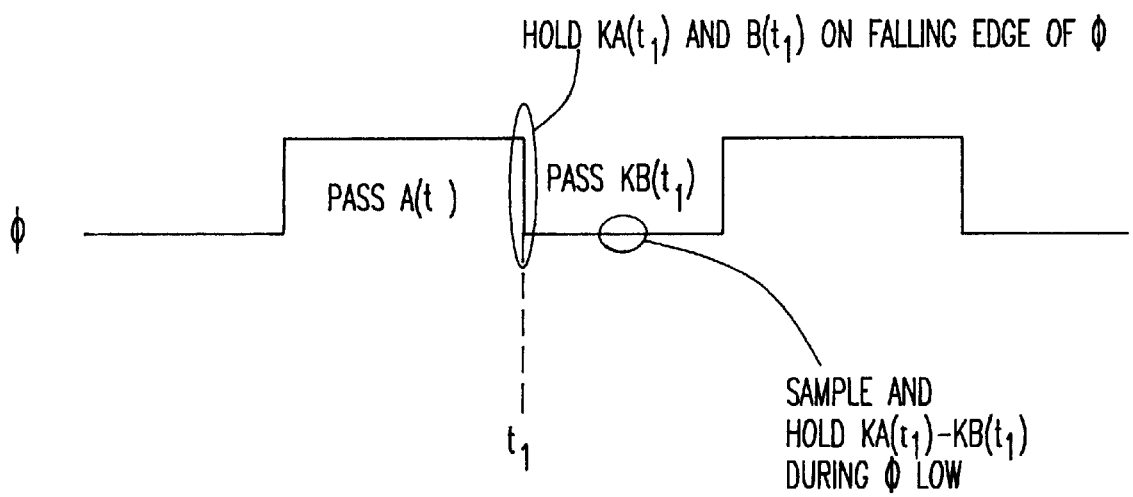
FIG. 3 is a timing diagram of the clock waveform depicting critical points in time in the operation of the circuit shown in FIG. 2.

The present invention is a method and circuit for canceling the error caused by this DC offset. FIG. 2 is a block diagram of the circuit architecture, and FIG. 3 is a timing diagram of the clock for the circuit. The following functional description refers to both FIGS. 2 and 3. When clock $\phi$ is high, signal A is selected by multiplexer (mux) 21, amplified by amplifier 24, and tracked by track and hold (T/H) circuit 25. At the same time, signal B is tracked by track and hold (T/H) circuit 22. When the clock $\phi$ goes low, track and hold circuit 22 holds the voltage $B(t_1)$, and track and hold circuit 25 holds the voltage $K \times A(t_1)$. These voltages are held for the entire interval when clock $\phi$ is low. Also during the interval when clock $\phi$ is low, multiplexer 21 selects the output of track and hold circuit 22 so that this voltage is now amplified by amplifier 24 to produce voltage $K \times B(t_1)$. During this time interval, the output of track and hold circuit 25 ($K \times A(t_1)$) and the output of the amplifier 24 ($K \times B(t_1)$) are input to summer circuit 26 having positive and negative inputs. The output $K(A(t_1) - B(t_1))$ is available from the summer circuit 26 when the clock $\phi$ is low. When the clock $\phi$ is high, the output of the summer circuit 26 is $K(A(t) - A(t))$ or zero. Thus, when the clock $\phi$ is low, the output of the summer circuit 26 is sampled and held as the output of the circuit.

The timing diagram of FIG. 3 illustrates the operation of the circuit. Cancellation of DC offset is achieved by passing signal A through amplifier 24 when the clock signal $\phi$ is high. On the falling edge of the clock signal $\phi$, here denoted as time $t_1$, the amplified signal $K \times A(t_1)$ is sampled and held in track and hold circuit 25. Also on the falling edge of the clock signal $\phi$, the signal $B(t_1)$ is sampled and held in track and hold circuit 22. At this point, the signal $B(t_1)$ is passed by multiplexer 21 and amplified by amplifier 24 to produce and output signal $K \times B(t_1)$. The signals $K \times A(t_1)$ from track and hold circuit 25 and $K \times B(t_1)$ from amplifier 24 are input to positive and negative inputs of summer circuit 26. While the clock signal $\phi$ is low, the output of the summer circuit 26 is sampled and held.

The following table shows the voltage at the nodes in the system as indicated by the corresponding numerals 1 to 5 in FIG. 2 during successive time intervals N and N+1.

| | N | N + 1 |
|---|---|---|
| Node 1 | B(t) | $B(t_n)$ |
| Node 2 | A(t) | $B(t_n)$ |
| Node 3 | K × A(t) | K × $B(t_n)$ |
| Node 4 | K × A(t) | K × $A(t_n)$ |
| Node 5 | K × A(t) − K × A(t) + Voss = Voss | K × $A(t_n)$ − K × $B(t_n)$ + Voss |

Notes:
1. Voss is the DC offset of the summer circuit 26.
2. $A(t_n)$ and $B(t_n)$ are the values of signals A and B respectively at the end of time interval N.

Sequential digital processing of the voltage at node 5 can cancel the offset Voss of the summer circuit 26. The process is to digitize the voltage at node 5 with analog to digital converter 27 during time interval N and store it in registers 28. Then digitize with analog to digital converter 27 and store in registers 28 the voltage at node 5 during the time interval N+1. The two digitized values are then subtracted. The resulting output $$K \times A(t_n) - K \times B(t_n) + Voss - Voss = K \times A(t_n) - K \times B(t_n)$$

is the desired output.

Figure 4:
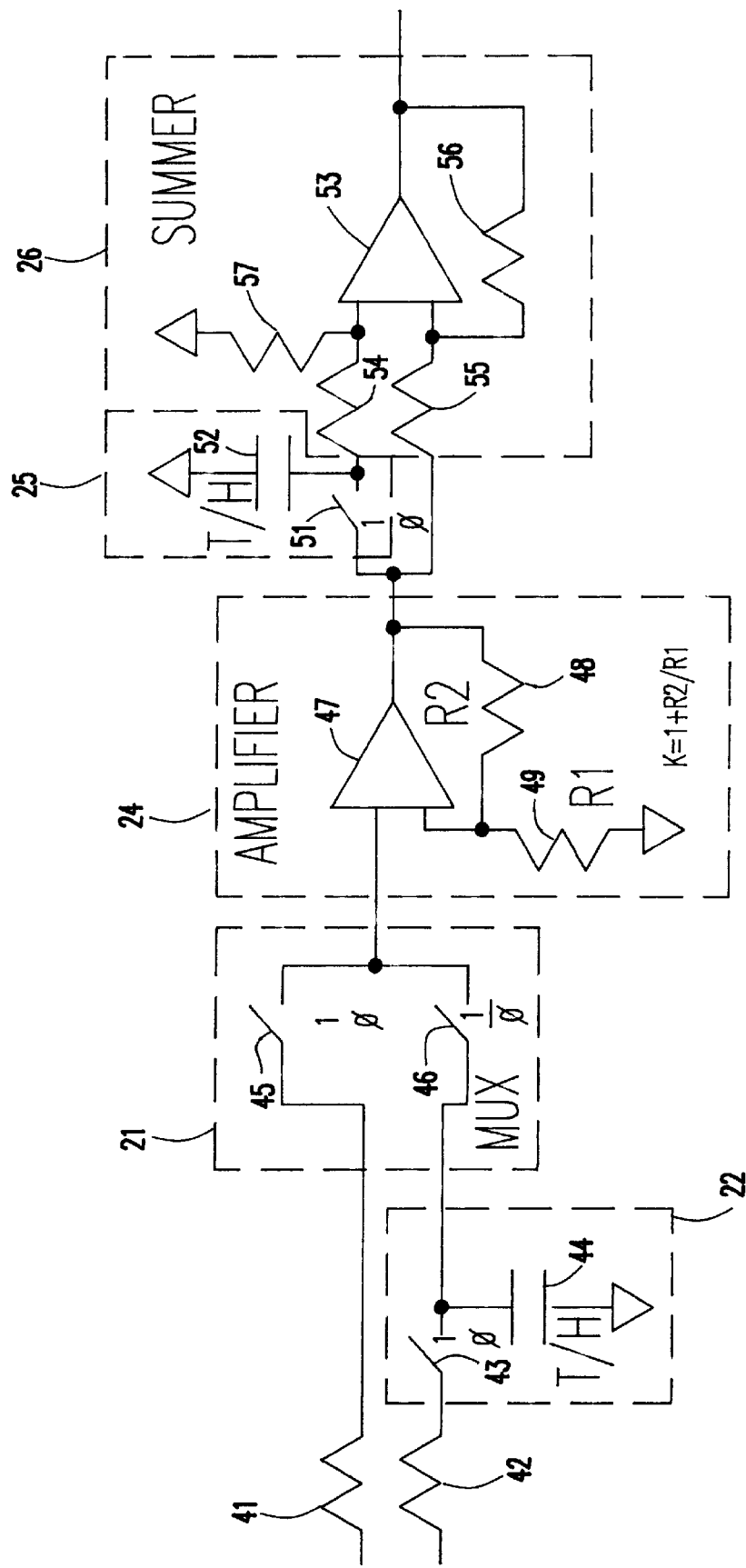
FIG. 4 is a block and schematic diagram of the temporal offset cancellation system according to the invention.

FIG. 4 is a block and schematic diagram showing an implementation of the circuit architecture shown in FIG. 2. The input signals are input to input resistors 41 and 42, respectively. Input resistor 41 is connected directly to one input of multiplexer 21, while input resistor 42 is connected to track and hold circuit 22, the output of which is connected to the second input of multiplexer 21. Track and hold circuit 22 comprises a switch 43 which closed while the clock signal ϕ is positive. The switch 43 is preferably implemented as a solid state switch in Complementary Metal Oxide Semiconductor (CMOS) Field Effect Transistor (FET) technology. During the time the switch 43 conducts, the input voltage is tracked, charging capacitor 44, also implemented in CMOS technology. On the falling edge of the clock signal ϕ, the switch 43 ceases to conduct, storing the sampled voltage on the capacitor 44. The multiplexer 21 comprises two switches 45 and 46, implemented in CMOS FET technology. Switch 45 is controlled by clock signal ϕ, while switch 46 is controlled by an inverted version of clock signal ϕ. The output of the multiplexer 21 is input to amplifier 24. The amplifier 24 comprises an amplifier 47 having positive and negative inputs. The output from the multiplexer is connected to the positive input of the amplifier 47. A feedback resistor 48 is connected between the output of the amplifier 47 and its negative input. Also connected between the negative input and ground is a resistor 49. If the value of resistor 49 is R1 and the value of resistor 48 is R2, then the gain, K, of the amplifier 47 is 1+R2/R 1.

The output of amplifier 47 is connected to the track and hold circuit 25 and the negative input of summer circuit 26. The track and hold circuit 25 is similar in construction to track and hold circuit 22 and comprises a switch 51 and a capacitor 52. The switch 51 is controlled by clock signal ϕ. The output of the track and hold circuit 25 is input to the positive input of the summer circuit 26. The summer circuit 26 comprises a differential amplifier 53 having two input resistors 54 and 55 connected respectively to positive and negative inputs of the amplifier 53. A feedback resistor 56 is connected between the output and the negative input of amplifier 53. A further resistor 57 is connected between the positive input and ground of amplifier 53.

The novel approach of this invention is the amplification of one signal, the sampling of that amplified signal and, simultaneously, sampling the unamplified second signal, then amplifying the second sampled signal through the same amplifier. The two amplified signals are then subtracted to remove the DC offset of the amplifier. A further refinement is subtracting out the offset of the summer circuit which is available during one phase of the clock from the difference of the amplified sampled first and second signals plus the offset of the summer circuit, which is available during the other phase of the clock. The signal processing to eliminate the summer circuit offset may be performed using an analog-to-digital converter and registers to store the desired voltage output plus the summer circuit's offset. Additional logic elements may include a register to save offset, a register to save voltage plus offset, and a subtracting circuit to calculate: (voltage+offset)−offset=voltage.

Certain assumptions are made concerning the attributes of the system, which include: 1) the frequency response of the system is much greater than the input frequency, thereby making negligible the time delay through the multiplexer and amplifier, and 2) track and hold circuits provide superior matching capability compared to the offset introduced by an amplifier.

In this invention, cancellation of the DC offset is achieved by:

Sampling two signals at the same point in time;
Amplifying the two signals with the same amplifier at different points in time; and
Subtracting one amplified signal from the other amplified signal. There may be offset introduced in the summer circuit which calculates the difference of the amplified signals. However, since the signals are already amplified, the percentage of error introduced by the summer circuit is reduced significantly (by a factor equal to the gain of the circuit). In addition, this invention provides a way by which the offset of the summer circuit can be eliminated from the desired output.

While the invention has been described in terms of a single preferred embodiment, those skilled in the art will recognize that the invention can be practiced with modification within the spirit and scope of the appended claims.

We claim:

1. A method of canceling a DC offset in an amplifier, the method comprising the steps of:
   simultaneously receiving two input signals during a first phase of a clock signal;
   amplifying a first one of the input signals with said amplifier and storing the amplified first one of the input signals and, simultaneously, storing a second one of the input signals during said first phase of the clock signal;
   amplifying said stored second one of the input signals with said amplifier during a second phase of the clock signal;
   summing the amplified stored second one of the input signals with the stored amplified first one of the input signals during said second phase of the clock signal; and
   outputting a difference signal of said stored amplified first one of the input signals and the amplified stored second one of the input signals to cancel the DC offset.

2. The method of canceling a DC offset in an amplifier recited in claim 1, further comprising the step of sampling the difference signal during said second phase of the clock signal.

3. The method of canceling a DC offset in an amplifier recited in claim 2, further comprising the step of processing said difference signal during said first phase of the clock signal.

4. The method of canceling a DC offset in an amplifier recited in claim 3, wherein the step of summing introduces a further offset, and wherein the step of processing includes the step of canceling said further offset.

5. The method of canceling a DC offset in an amplifier recited in claim 4, wherein the step of canceling said further offset comprises the steps of
   converting said difference signal to a first digital value during said second phase of the clock signal and storing said first digital value;
   converting said difference signal to a second digital value during said first phase of the clock signal and storing said second digital value; and
   subtracting said second digital value from said first digital value.

6. A DC offset cancellation circuit comprising:
   a first input and a second input respectively receiving first and second input signals;
   a first track and hold circuit connected to said second input, said first track and hold circuit sampling said second signal during a first phase of a clock signal;
   a multiplexer connected to said first input and to said first track and hold circuit, said multiplexer outputting a signal from said first input during said first phase of the clock signal and outputting a signal from the first track and hold circuit during a second phase of said clock signal;

an amplifier connected to amplify an output of said multiplexer;

a second track and hold circuit connected to an output of said amplifier, said second track and hold circuit sampling an output signal of said amplifier during said first phase of said clock signal;

a summer circuit having positive and negative inputs, said positive input being connected to an output of said second track and hold circuit and said negative input being directly connected to the output of said amplifier.

7. The DC offset cancellation circuit recited in claim 6, further comprising means for sampling and holding an output of said summer circuit during said second phase of said clock signal.

8. The DC offset cancellation circuit recited in claim 7, further comprising means for processing the sampled and held output of the summer circuit.

9. The DC offset cancellation circuit recited in claim 6, wherein said summer circuit produces a further offset, said cancellation circuit further comprising:

an analog to digital converter connected to receive an output of said summer circuit and generating a first digitized value during said second phase of the clock signal and a second digitized value during said first phase of the clock signal;

means for storing said first and second digitized values; and means for subtracting said second digitized value from said first digitized value to cancel said further offset.

* * * * *